United States Patent
Terakado et al.

(10) Patent No.: US 6,491,203 B2
(45) Date of Patent: Dec. 10, 2002

(54) WIRE BONDING APPARATUS

(75) Inventors: Yoshimitsu Terakado, Hachioji (JP); Kazumasa Sasakura, Higashiyamato (JP)

(73) Assignee: Kabushiki Kaisha Shinkawa, Tokyo (JP)

(*) Notice: Subject to any disclaimer, the term of this patent is extended or adjusted under 35 U.S.C. 154(b) by 0 days.

(21) Appl. No.: 09/727,002

(22) Filed: Nov. 30, 2000

(65) Prior Publication Data

US 2001/0002032 A1 May 31, 2001

(30) Foreign Application Priority Data

Nov. 30, 1999 (JP) .............................. 11-338886

(51) Int. Cl.[7] .................... B23K 37/00; B23K 31/00; B23K 31/02
(52) U.S. Cl. .................. 228/4.5; 228/4.5; 228/180.5; 228/102; 219/56.21
(58) Field of Search .............. 228/4.5, 180.5, 228/904, 102; 219/56.21; 318/254

(56) References Cited

U.S. PATENT DOCUMENTS

| | | | | |
|---|---|---|---|---|
| 4,438,880 A | * | 3/1984 | Smith et al. ............ 228/1 A |
| 4,565,956 A | * | 1/1986 | Zimmermann et al. ..... 318/721 |
| 4,575,602 A | * | 3/1986 | Sakurai ................... 219/56.21 |
| 4,597,522 A | * | 7/1986 | Kobyashi ................ 228/179 |
| 5,124,625 A | * | 6/1992 | Wakabayashi ............ 318/603 |
| 5,474,224 A | * | 12/1995 | Nishimaki et al. ......... 228/102 |
| 5,485,063 A | * | 1/1996 | Mochida et al. .......... 318/34 |
| 5,760,359 A | * | 6/1998 | Nakano et al. .......... 318/603 |
| 6,129,255 A | * | 10/2000 | Terakado et al. ......... 228/4.5 |

FOREIGN PATENT DOCUMENTS

| | | | |
|---|---|---|---|
| JP | H1-58861 | 12/1989 | |
| JP | 4-279039 | * 10/1992 | ........... 228/180.5 |
| JP | 7-169789 | * 7/1995 | ........... 228/180.5 |
| JP | 9-16262 | * 1/1997 | ........... 228/180.5 |
| JP | H9-20511 | 8/1997 | |

* cited by examiner

Primary Examiner—M. Alexandra Elve
Assistant Examiner—L. Edmondson
(74) Attorney, Agent, or Firm—Koda & Androlia

(57) ABSTRACT

A wire bonding apparatus equipped with a capillary through which a wire is passed, a torch electrode which is installed in a substantially horizontally movable manner so as to be positioned beneath the capillary, and a torch electrode driver which drives the torch electrode, in which the torch electrode is directly coupled to an output shaft of a pulse motor which is driven by a high-resolution angle control circuit, so that a resolution of the pulse motor obtained by the high-resolution angle control circuit is 30,000 parts per revolution or greater.

2 Claims, 3 Drawing Sheets

WIRE BONDING APPARATUS

BACKGROUND OF THE INVENTION

1. Field of the Invention

The present invention relates to a wire bonding apparatus, and more particularly, to a wire bonding apparatus that is equipped with a movable torch electrode.

2. Prior Art

In a movable torch electrode system, the torch electrode is installed so that it can move horizontally. The torch electrode is positioned beneath the tip end of the wire extending from the tip end of the capillary and is caused to discharge so as to form a ball on the tip end of the wire. Following this ball formation, the torch electrode is retracted from beneath the capillary.

Japanese Patent Application Publication (Kokoku) No. H1-58861 and Japanese Patent Application Laid-Open (Kokai) No. H9-205110 disclose bonding apparatuses equipped with movable torch electrodes of the type described above.

In Japanese Patent Application Publication (Kokoku) No. H1-58861, a metal electrode is formed at the tip end of the capillary, so that an electrical arc can be produced between the metal electrode and the movable torch electrode.

The movable torch electrode system of Japanese Patent Application Laid-Open (Kokai) No. H9-205110 includes an actuator that comprises a lateral actuating arm, a spring, a stopper and a solenoid. The actuating arm is installed so as to be movable in a horizontal direction, and a torch electrode is attached to this actuating arm. The spring pulls the lateral actuating arm toward the area beneath the capillary. The stopper positions the lateral actuating arm beneath the capillary, and the solenoid drives the lateral actuating arm so that the torch electrode is retracted from beneath the capillary.

When the solenoid is switched on, the lateral actuating arm is pulled by the magnetic force of the solenoid so that the torch electrode is retracted from beneath the capillary. When the solenoid is switched off, the lateral actuating and is caused to move beneath the capillary by the driving force of the spring, and it stops when the torch electrode contacts the stopper.

In the prior art described above, the torch electrode is stopped by way of causing the electrode to come into contact with a stopper. However, this leads to noise and causes dust as a result of wear. Furthermore, since the range of movement of the torch electrode is limited by the solenoid and stopper, there is no degree of freedom in the position of the torch electrode, and the torch electrode constitutes an obstacle. Thus, the working characteristics of wire threading, capillary replacement, etc. tend to be poor. Moreover, since driving is accomplished by a spring and solenoid, the speed of the apparatus cannot be increased.

Accordingly, the inventors of the present application invented a wire bonding apparatus in which the torch electrode is directly coupled to the output shaft of a pulse motor (Japanese Patent Application No. H11-35283). This wire bonding apparatus is superior in terms of quiet operation and in terms of working characteristics since the movement range of the torch electrode has a high degree of freedom. Also, it can increase the speed of the apparatus. However, in conventional pulse motor control methods, vibration of the torch electrode occurs with each pulse, and the residual vibration at the time of stopping is especially violent.

SUMMARY OF THE INVENTION

Accordingly, the object of the present invention is to provide a wire bonding apparatus that can minimize vibration of torch electrode and that is quiet in operation, has excellent working characteristics with high movement range of the torch electrode, and can increase the speed of the bonding apparatus.

The above object is accomplished by a unique structure of the present invention for a wire bonding apparatus which is equipped with a capillary through which a wire is passed, a torch electrode which is installed in a substantially horizontally movable manner so that the torch electrode is positioned beneath the capillary, and a torch electrode driving means which drives the torch electrode; and in the present invention, the torch electrode is directly coupled to the output shaft of a pulse motor, and this pulse motor is driven by a high-resolution angle control circuit.

In the above structure of the present invention, the resolution of the pulse motor obtained by the high-resolution angle control circuit is 30,000 parts per revolution or greater.

DETAILED DESCRIPTION OF THE INVENTION

One embodiment of the wire bonding apparatus of the present application will be described with reference to FIGS. 1 and 2.

Figure 1:
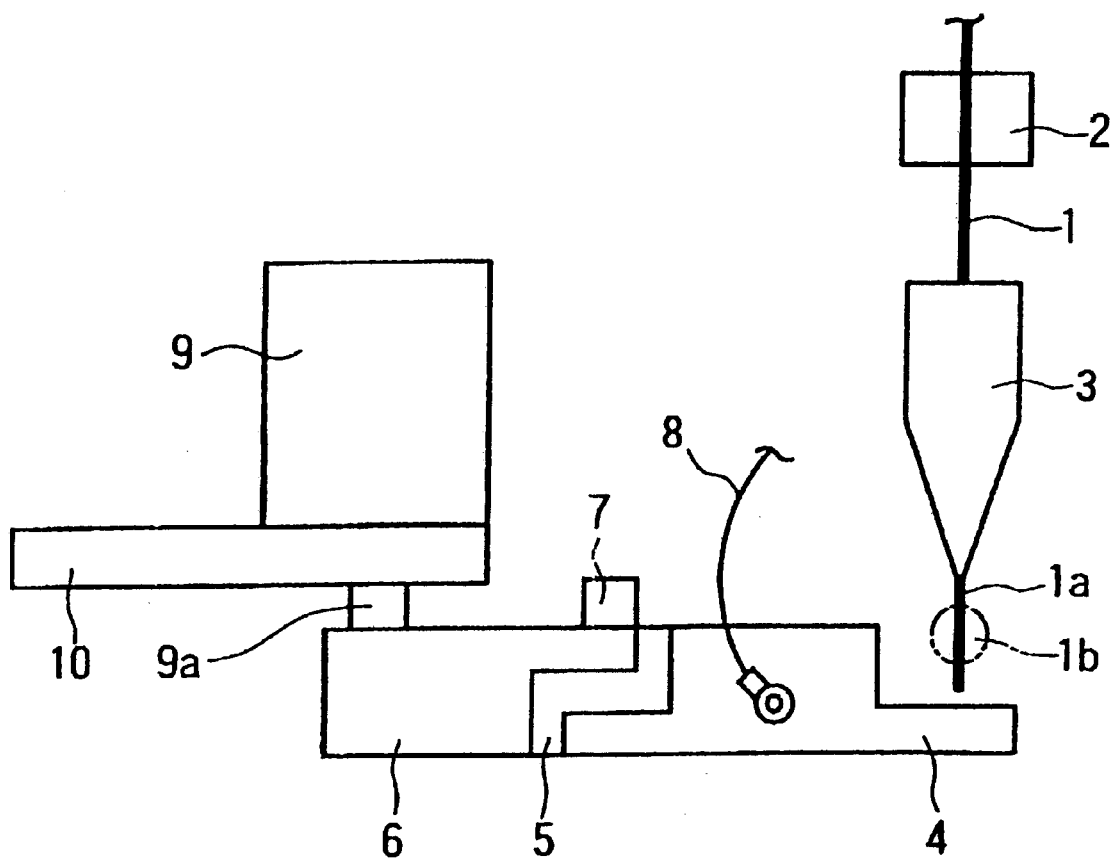
FIG. 1 is a front view of the wire bonding apparatus according to one embodiment of the present invention.

In FIG. 1, the reference numeral 3 is a capillary, and a wire 1 is passed through this capillary 3 via a damper 2. A torch electrode 4 is fastened to a torch electrode holding member 6 by a fastening screw 7 with an insulating member 5 interposed between the torch electrode 4 and the torch electrode holding member 6. Me torch electrode holding member 6 is fastened to the output shaft 9a of a pulse motor (also called a "stepping motor") 9, which is installed in an upright position. The pulse motor 9 is fastened to a bonding head (not shown) via a motor supporting member 10. The torch electrode 4 is connected to a high-voltage power supply (not shown) via a high-voltage output line 8.

Figure 2:
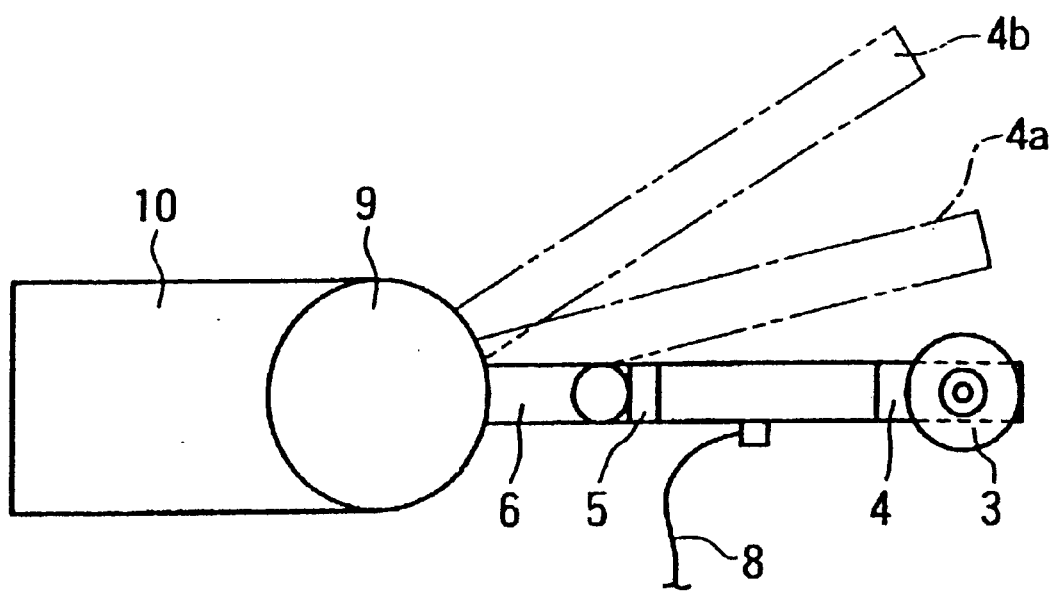
FIG. 2 is a plan view thereof.

FIG. 2 shows various positions of the torch electrode 4. The solid line indicates the discharge position during bonding, the one-dot chain line indicates the retracted position 4a during bonding, and the two-dot chain line indicates the "stop" position 4b. At the time of ball formation, the pulse motor 9 rotates so that the torch electrode 4 pivots about the output shaft 9a, thus causing the torch electrode 4 to move from the retracted position 4a indicated by the one-dot chain line to the position beneath the tail 1a (see FIG. 1) extending from the tip end of the capillary 3 as indicated by the solid line. Then, an electrical discharge is performed to the tip end of the tail 1a by the torch electrode 4 so as to form a ball 1b at the end of the wire 1. Afterward, the pulse motor 9 rotates in the reverse direction and returns the torch electrode 4 back to the retracted position 4a indicated by the one-dot chain line.

As seen from the above, the stopping position of the torch electrode 4 can be freely controlled. Accordingly, a stopper of the type used in conventional systems is unnecessary, and quiet operation is accomplished. Furthermore, since the torch electrode 4 is driven under direct coupling with the output shaft 9a of the pulse motor 9, the speed of the movement of the torch is high. Moreover, since the degree of freedom in the range of movement of the torch electrode 4 is high, the pulse motor 9 can be driven so that the torch electrode 4 is positioned at a position 4c that is away from the capillary 3 as indicated by the two-dot chain line during operations of, for instance, threading of the wire through the capillary 3, the replacement of the capillary, etc. Accordingly, the torch electrode 4 is prevented from causing any interference, and good working characteristics of wire threading and capillary replacement, etc. can be provided.

As described above, a high voltage is applied to the torch electrode 4. Accordingly, in the direct coupling structure of the pulse motor 9 to the torch electrode 4, it is necessary to install an insulating member between the torch electrode 4 and the output shaft 9a of the pulse motor 9. Consequently, in the above embodiment, the torch electrode holding member 6 is fastened to the output shaft 9a, and the torch electrode 4 is directly coupled to this torch electrode holding member 6 with an insulating member 5 in between. In other words, the torch electrode 4 is fastened to the torch electrode holding member 6 with the insulating member 5 in between so that the torch electrode 4 and torch electrode holding member 6 form an integral unit. Thus, the torch electrode 4 is directly coupled to the pulse motor 9.

Figure 3:
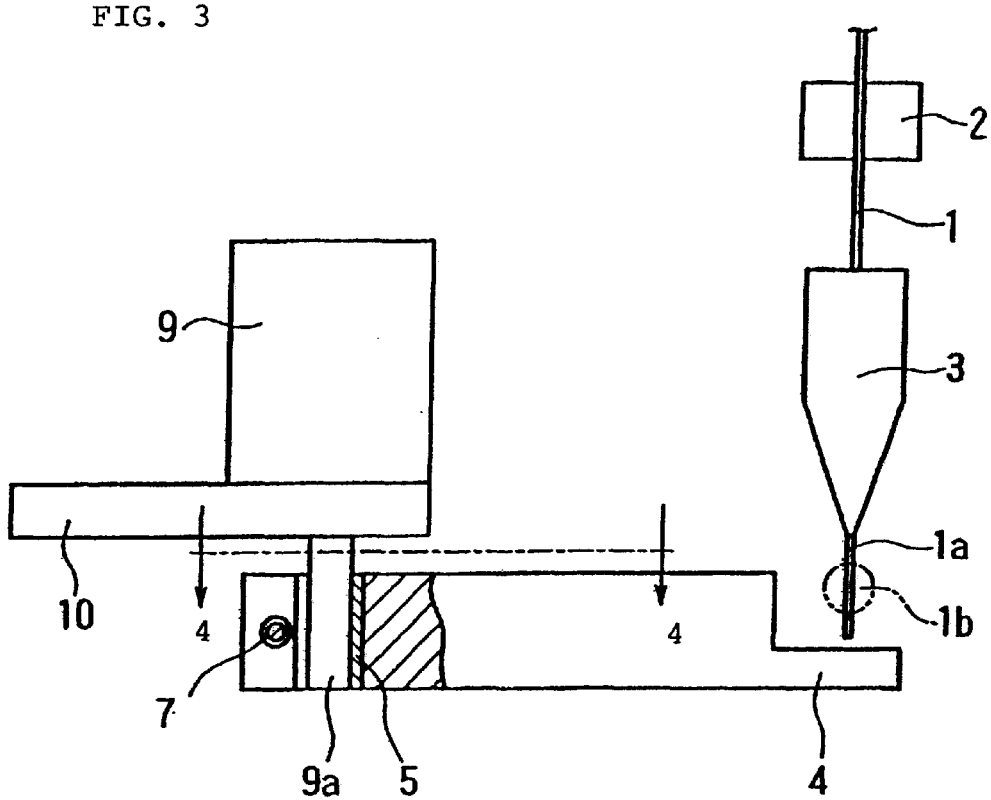
FIG. 3 is partially sectional front view of another embodiment of the wire bonding apparatus of the present invention.
Figure 4:
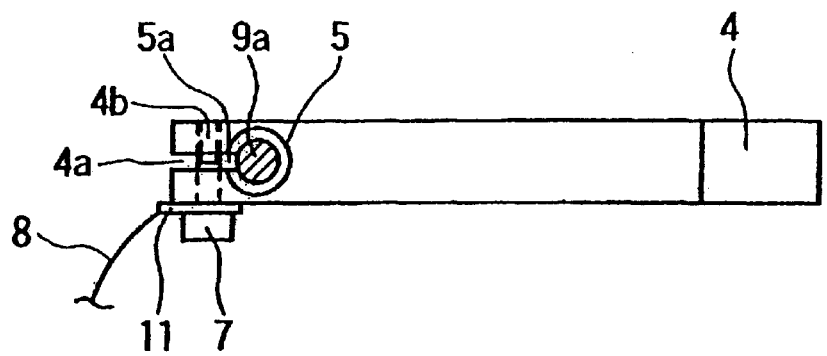
FIG. 4 is a sectional view taken along the line 4—4 in FIG. 3.

FIGS. 3 and 4 illustrate another embodiment of the present invention in which the pulse motor 9 is directly coupled to the torch electrode 4. In this second embodiment, a ring-form insulating member 5 is employed. The insulating member 5 has a split groove 5a and is installed so as to cover the output shaft 9a of the pulse motor 9, and the torch electrode 4 is fastened to the output shaft 9a by a fastening screw 7 with this insulating member 5 interposed between the torch electrode 4 and the output shaft 9a. Furthermore, a split (vertical) groove 4a is formed in the torch electrode 4, and a threaded part 4b is also formed in the torch electrode 4 so that the fastening screw 7 engages with this threaded part 4b so that the screw 7 tightens the split groove 4a.

With the structure above, a ring-form terminal 11 to which the high-voltage output line 8 is attached is fitted over the fastening screw 7, and the fastening screw 7 is tightened in the threaded part 4b of the torch electrode 4. As a result, the torch electrode 4 is fastened to the output shaft 9a of the pulse motor 9 with the insulating member 5 in between. An effect substantially the same as that of the embodiment described with reference to FIGS. 1 and 2 can be obtained using this structure as well.

Figure 7:
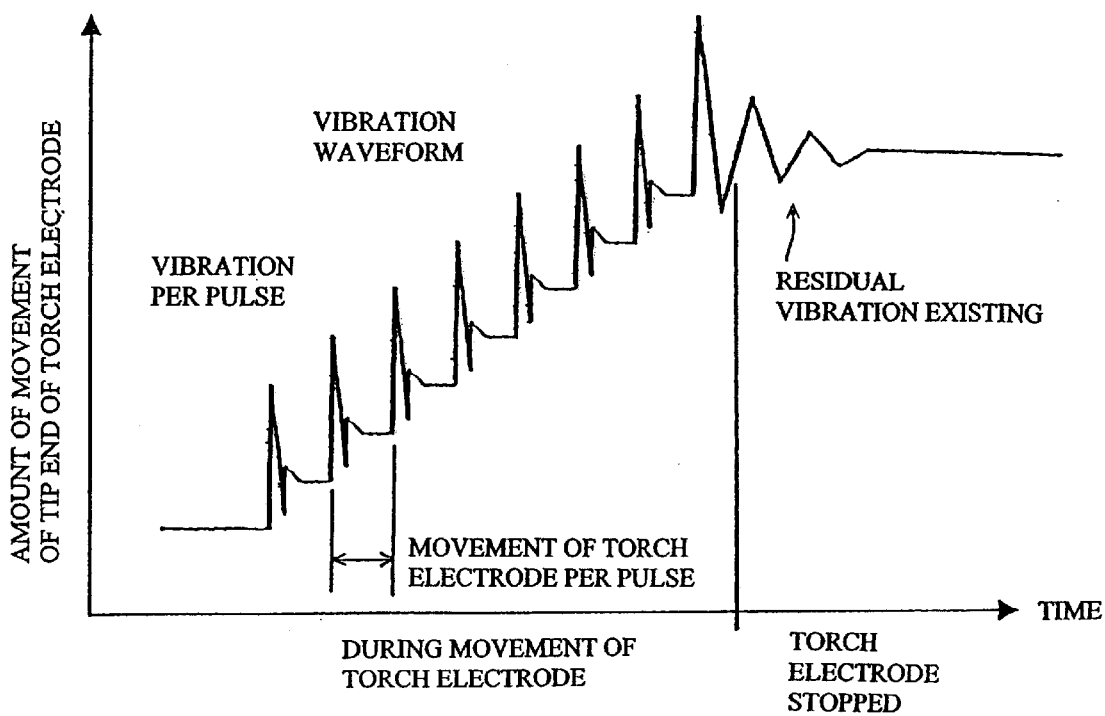
FIG. 7 is a diagram of the vibration waveform of the tip end portion of the torch electrode of conventional control.

In FIG. 1, the distance in which the tip end portion of the torch electrode 4 is moved from the retracted position 4a indicated by the one-dot chain line to the discharge position indicated by the solid line is, for instance, approximately 2 mm (an angle of approximately 2.9 degrees). This movement requires approximately 8 pulses if a conventional control method is used to control a pulse motor, since the resolution is 1,000 parts per revolution of the pulse motor in the case of such a method. In this control method, vibration is generated with each pulse as shown in FIG. 7, and the residual vibration that occurs when the torch electrode 4 is stopped is especially severe.

Figure 5:
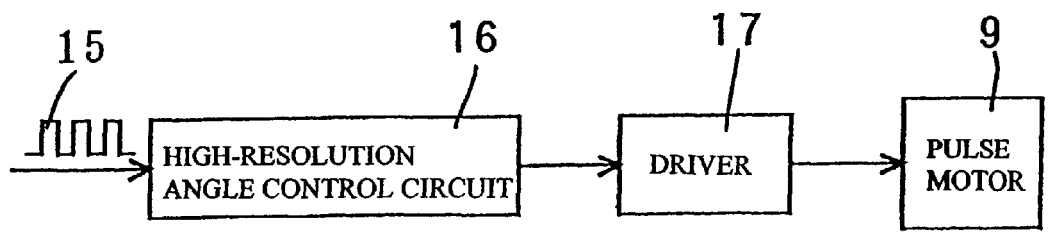
FIG. 5 is a block diagram which illustrates the pulse motor control used in the wire bonding apparatus of the present invention.

In the present invention, as shown in FIG. 5, the movement pulses 15 that are inputted into the pulse motor 9 are inputted in high-resolution angle control circuit 16, and the output of this high-resolution angle control circuit 16 is inputted into the pulse motor 9 via a driver 17. Here, the pulse motor 9 used is PMM33B2 model (5-phase pulse motor) manufactured by Oriental Motor Co., Ltd., the high-resolution angle control circuit 16 is an EIC4051 model manufactured by the same firm, and the driver 17 is an EIC4021 or EIC4011 manufactured also by Oriental Motor Co., Ltd.

Figure 6:
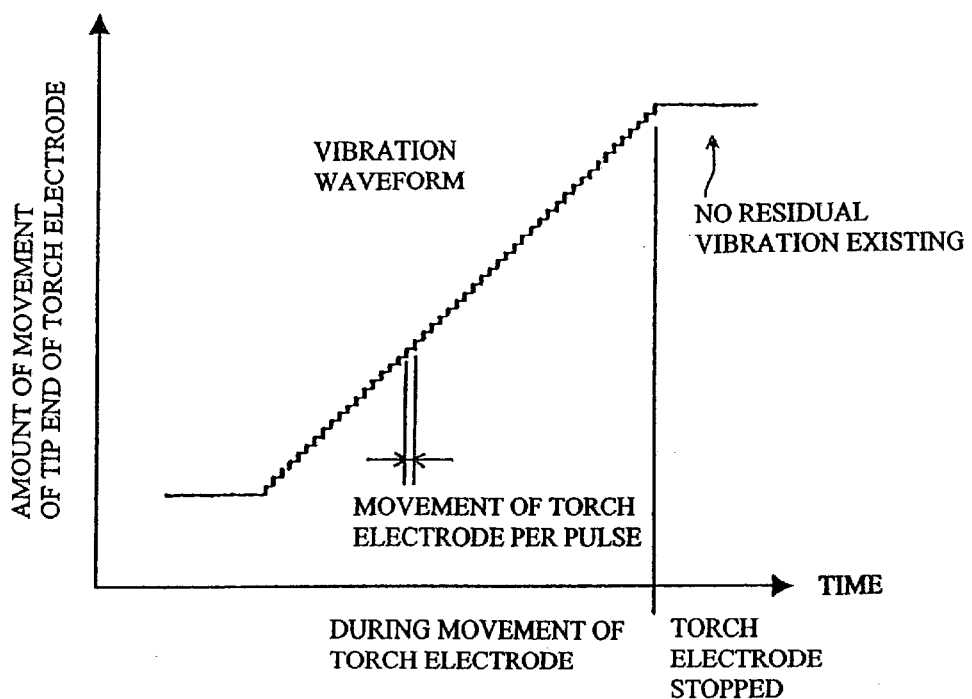
FIG. 6 is a diagram of the vibration waveform of the tip end portion of the torch electrode when controlled by the diagram shown in FIG. 5.

In a case where the tip end portion of the torch electrode 4 is moved approximately 2 mm (an angle of approximately 2.9 degrees), the resolution of the pulse motor 9 is increased to a high value of 40,000 parts per revolution of the pulse motor 9 by the high-resolution angle control circuit 16. As a result, the motor can be driven by approximately 300 pulses, which is 37.5 times the number of pulses used in a conventional control method. FIG. 6 shows the vibration waveform of the tip end portion of the torch electrode when controlled by the diagram shown in FIG. 5.

Accordingly, in the present invention, the control is extremely finely divided as shown in FIG. 5, and complex control of acceleration, deceleration, etc. is possible. As a result, it is possible to keep vibration of the tip end portion of the torch electrode 4 at a minimum value. The resolution of the pulse motor 9 is not limited to 40,000 parts per revolution of the pulse motor 9, and any resolution of 30,000 parts per revolution or greater is extremely effective.

As described in detail in the above, in the present invention, the torch electrode is directly coupled to the output shaft of a pulse motor, and this pulse motor is driven by a high-resolution angle control circuit. Accordingly, the present invention is superior in terms of quiet operation. The degree of freedom of the range of movement of the torch electrode is high, providing superior working characteristics. Moreover, high speed operation can be accomplished, and vibration of the torch electrode can be kept to a minimum.

What is claimed is:

1. A wire bonding apparatus which is equipped with: a capillary through which a wire is passed, a torch electrode which is installed in a substantially horizontally movable manner so as to be positioned beneath said capillary, and a torch electrode driving means which drives said torch electrode, wherein said torch electrode is directly coupled to an output shaft of a high resolution pulse motor, and said high resolution pulse motor is driven by a high-resolution angle control circuit.

2. The wire bonding apparatus according to claim 1, wherein a resolution of said high resolution pulse motor and said high-resolution angle control circuit is 30,000 parts per revolution or greater.

* * * * *